United States Patent
Lee et al.

(10) Patent No.: US 7,060,577 B2
(45) Date of Patent: Jun. 13, 2006

(54) METHOD FOR FORMING METAL SILICIDE LAYER IN ACTIVE AREA OF SEMICONDUCTOR DEVICE

(75) Inventors: In-Haeng Lee, Kyoungki-do (KR); Yoon-Jik Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 109 days.

(21) Appl. No.: 10/613,331

(22) Filed: Jul. 3, 2003

(65) Prior Publication Data

US 2004/0082168 A1    Apr. 29, 2004

(30) Foreign Application Priority Data

Jul. 5, 2002    (KR) ............... 10-2002-0038977

(51) Int. Cl.
*H01L 21/336* (2006.01)
(52) U.S. Cl. .................... 438/301; 438/649
(58) Field of Classification Search ............. 438/197, 438/199, 299–301, 142, 582–584, 649, 655, 438/656, 664, 721, 758, 785, 795, FOR 630; 257/333, 336, 344, E21.43, E29.156, E21.164, 257/E21.203, E21.296, E21.593
See application file for complete search history.

(56) References Cited

U.S. PATENT DOCUMENTS

| | | | | |
|---|---|---|---|---|
| 5,110,757 A | * | 5/1992 | Arst et al. | 438/489 |
| 5,168,072 A | * | 12/1992 | Moslehi | 438/300 |
| 5,173,327 A | * | 12/1992 | Sandhu et al. | 438/680 |
| 5,843,826 A | * | 12/1998 | Hong | 438/300 |
| 6,063,703 A | * | 5/2000 | Shinriki et al. | 438/653 |
| 6,087,235 A | * | 7/2000 | Yu | 438/300 |
| 6,599,841 B1 | * | 7/2003 | Komada | 438/706 |

FOREIGN PATENT DOCUMENTS

| | | |
|---|---|---|
| JP | 2001-068432 | 3/2001 |
| KR | 20000045351 A | 7/2000 |
| KR | 20010029842 A | 4/2001 |

* cited by examiner

*Primary Examiner*—Brook Kebede
(74) *Attorney, Agent, or Firm*—Marshall, Gerstein & Borun LLP

(57) ABSTRACT

The present invention provides a method for forming a metal silicide layer in an active area of the semiconductor device. The method for forming the metal silicide layer includes: forming a source/drain junction area on a silicon substrate; forming an attack protection layer on the source/drain junction area, wherein the attack protection layer is electrically conductive and prevents a silicon substrate attack caused by chlorine (Cl) gas; forming a titanium (Ti) layer over the attack protection layer through a low pressure chemical vapor deposition (LPCVD) process using a source gas of $TiCl_4$; and diffusing the Ti layer into the attack protection layer to thereby form a metal silicide layer.

28 Claims, 2 Drawing Sheets

METHOD FOR FORMING METAL SILICIDE LAYER IN ACTIVE AREA OF SEMICONDUCTOR DEVICE

FIELD OF THE INVENTION

The present invention relates to a method for fabricating a semiconductor device; and, more particularly, to a method for forming a metal silicide layer in an active area of the semiconductor device.

DESCRIPTION OF RELATED ARTS

A barrier metal such as titanium, titanium nitride, and so on is used to prevent a junction spiking generated on an N type or P-type source/drain junction area, i.e., an active area and a contact area to which an aluminum (Al) wire is contacted prior to depositing a metal wire such as aluminum.

Recently, a semiconductor device is gradually down sized, since size of a contact is decreased and depth of the contact is gradually increased. In this case, it is difficult to obtain a good quality of titanium (Ti) layer at a contact bottom because step coverage of a barrier metal layer deposited by using a physical vapor deposition (PVD) process is poor.

Consequently, a contact resistance is increased because a Ti silicide ($TiSi_2$) is not formed properly. To alleviate the inferior contact resistance problem, a thickness of the Ti layer is increased. However, in this case, an over-hang is generated at an entrance of the contact, and thus, a gap-fill process is disturbed during a succeeding tungsten (W) deposition process using the PVD process.

On the other hand, the step coverage obtained by a chemical vapor deposition (CVD) process is superior to that obtained by the PVD process. Accordingly, it is possible to maintain a contact profile for a contact hole with a high aspect ratio and secure the Ti layer having a thickness with which a role of the Ti layer can be maintained. At this time, $TiCl_4$ gas is used as a source gas during the CVD process for forming the Ti layer.

FIG. 1 is a diagram showing a cross sectional view illustrating a conventional conductive wire with use of a barrier metal layer and a tungsten layer.

As shown, a gate electrode pattern having a structure constituted sequentially with a gate oxide layer 12, a gate conductive layer 13 and a gate hard mask 14 is formed over a silicon substrate 10. A nitride-based spacer 15 is formed to obtain an etch selectivity to an oxide-based inter-layer dielectric (ILD) layer. Herein, the spacer 15 is formed on lateral sides of the gate electrode pattern.

An active area 11 such as a source/drain junction area is formed in an predetermined area of the silicon substrate 10 which will be contacted to the gate electrode pattern, and a metal wire 19 including a titanium (Ti) or titanium/titanium nitride (TiN) barrier metal layer 17 which will be contacted to the active area 11, and a tungsten (W) layer 19 is formed thereafter.

A metal silicide layer 18 such as $TiSi_2$ is formed to obtain an ohmic contact. Herein, Ti contained in a contact area 17' of the Ti or TiN barrier metal layer 17 is then diffused into the active area 11 by a diffusion process such as a heat treatment process to thereby obtaining the metal silicide layer 18.

However, there exists a drawback when in order to obtain the metal silicide layer 18, the Ti is directly diffused into the active area 11 by using the diffusion process subjected to the contact area. That is, the Ti or TiN barrier metal layer 7 is formed directly on the active area 11 through the use of the CVD process employing $TiCl_4$ and $H_2$ gas. In that case, an additional and unwanted reaction between the active area 11 and chloride (Cl) generated from a CVD source gas, i.e., $TiCl_4$ gas occurs. As a result, in the subsequent process, i.e., the diffusion process, much more area of the active area 11 is unnecessarily occupied by the metal silicide layer 18.

As a result, a practical junction depth of the active area 11 is reduced, and this reduction is denoted as a reference mark 'A' in FIG. 1. As a result of this reduced junction depth of the active area 11, a leakage current from the active area 11 to the silicon substrate 10 is generated. Consequently, an operational property of the semiconductor device is deteriorated.

SUMMARY OF THE INVENTION

It is, therefore, an object of the present invention to provide a method for forming a metal silicide layer in an active area being capable of reducing unwanted occupation in the active area by the metal silicide layer to thereby effectively improve an operational property of a semiconductor device.

In accordance with an aspect of the present invention, there is provided the method for forming the metal silicide layer, including forming a source/drain junction area on a silicon substrate; forming an attack protection layer on the source/drain junction area, wherein the attack protection layer is electrically conductive and prevents a silicon substrate attack caused by chlorine (Cl) gas; forming a titanium (Ti) layer over the attack protection layer through a low pressure chemical vapor deposition (LPCVD) process using a source gas of $TiCl_4$; and diffusing the Ti layer into the attack protection layer to thereby forming a metal silicide layer.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Hereinafter, referring to the accompanying drawings, there is provided detailed description on an inventive method for forming a titanium nitride (TiN) layer through the use of a chemical vapor deposition (CVD) process employing a $TiCl_4$ source gas, and reducing an unwanted potion of an active area occupied by a titanium silicide layer.

Figure 1:
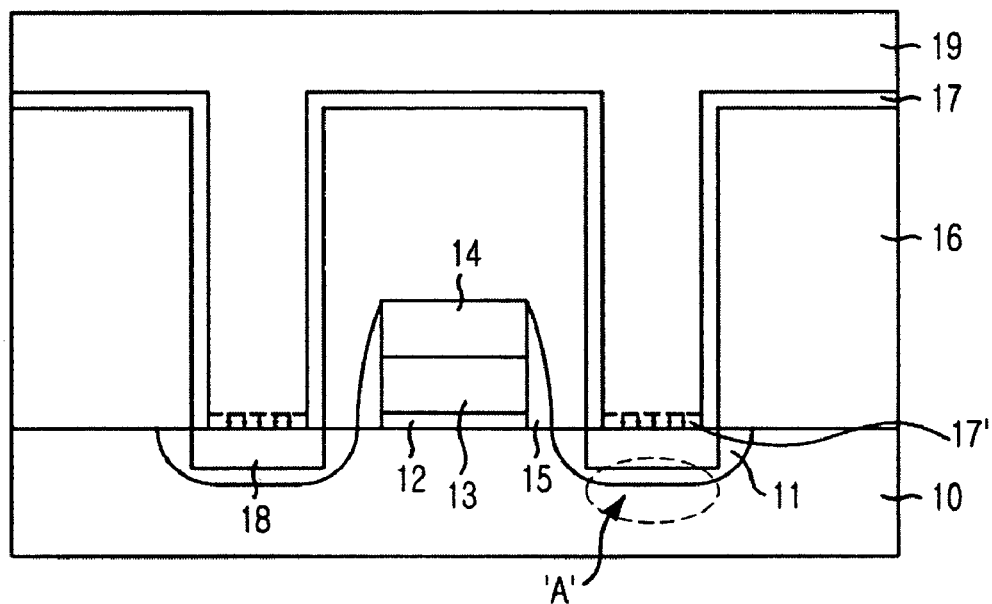
FIG. 1 is a cross-sectional view illustrating a conventional semiconductor device having a metal wire.
Figure 2A:
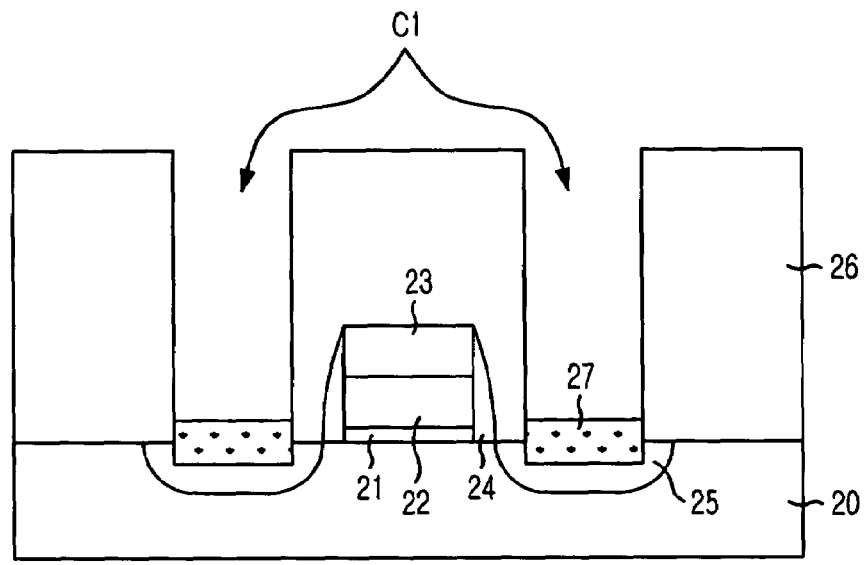
FIGS. 2A to 2B are cross-sectional views of a semiconductor device showing steps of a process for forming metal silicide layer in accordance with the present invention.
Figure 2B:
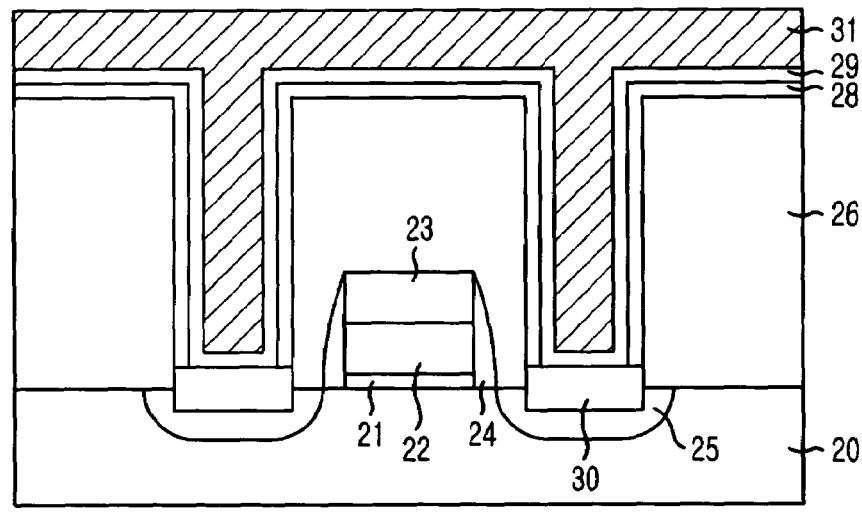

FIGS. 2A to 2B are cross-sectional views of the semiconductor device showing steps of a process for forming a titanium (Ti) layer or a Ti contained barrier metal layer in accordance with the present invention.

Referring to FIG. 2A, a plurality of conductive layer patterns formed over the semiconductor substrate 20, i.e., a gate electrode pattern is formed.

More specifically, an oxide-based gate insulation layer 21 is formed over the silicon substrate 20 and a gate electrode 22 is formed over the oxide-based gate insulation layer 21. A single layer or a stack of layers constituted with such materials as poly-silicon, tungsten, tungsten silicide and tungsten nitride is used to form the gate electrode 22. In addition, the hard mask 23 is formed over the gate electrode 22 by using tungsten, tungsten silicide, tungsten nitride layer or nitride layer.

In more detail, the hard mask 23 and the gate electrode 22 are formed through a photolithography process using a gate electrode mask after completing a series of the aforementioned stacking processes.

A nitride layer is deposited along the gate electrode pattern, and a spacer 24 is formed at lateral sides of the gate electrode pattern by carrying out a blanket etching process. The spacer 24 has a lightly doped drain (LDD) structure formed by using an ion implanting technique. Especially, the spacer 24 is used to prevent a loss of the gate electrode pattern by securing an etch selectivity to an oxide-based insulating layer during a self aligned contact (SAC) formation process.

A mask for an ion implantation is formed, and the ion implantation, i.e., $BF_2$ ion implantation is used to form an active area 25 at a P-type source/drain junction area on the silicon substrate 20. Herein, the P-type source/drain junction area on the silicon substrate is aligned on an area at which the gate electrode pattern is formed.

As a next step, an insulation layer 26, i.e., a single or a stack layer of a borophosphosilicate glass (BPSG) layer, an advanced planarization layer (APL), a high density plasma (HDP) layer or a hydrogen silsesquioxane (HSQ) layer is deposited to sufficiently fill up a separation area of the gate electrode pattern, wherein a thickness thereof ranges from approximately 2000 Å to approximately 10000 Å. Next, a planarization process for the insulation layer 26 is carried out through the use of a chemical mechanical polishing (CMP) process or a blanket etching process in order to secure a process margin for a succeeding photolithography process.

A photo-resist pattern (not illustrated) is then formed over the insulation layer 26 by using T-type or I-type mask. Herein, the photo-resist pattern is formed for the SAC process. The photo-resist pattern serving as an etching mask is used to selectively etch the insulation layer 26. As a result, a contact hole (not illustrated) exposing the active area 25 is formed.

During an insulation layer 26 etch process, fluorine (F) containing plasma gas such as $C_2F_4$, $C_2F_6$, $C_3F_8$, $C_4F_6$, $C_5F_8$ or $C_6F_6$, i.e., $C_xF_y$, wherein x and y ranges from 1 to 10 is generally used as a main etching gas during the SAC process. Herein, such gas for generating a polymer during the SAC process, i.e., $CH_2F_2$, $C_3HF_5$ or $CHF_3$ is also added thereto. At this time, an inert gas such as helium (He), neon (Ne), argon (Ar) or xenon (Xe) is used as a carrier gas. Accordingly, it is possible to obtain an etching profile of the SAC process capable of minimizing damage of a gate hard mask 23 by protecting an upper area of the gate hard mask 23. Next, the photo-resist pattern and etching remnants are removed by performing a photo-resist strip process and a cleaning process, respectively.

A titanium (Ti) layer and a titanium nitride (TiN) layer are then deposited to form a barrier metal layer having a Ti/TiN structure, and Ti silicide ($TiSi_2$) is formed through a thermal reaction between Ti and the silicon substrate 20, The $TiSi_2$ is used to form an ohmic contact between the barrier metal layer and the silicon substrate 20. In addition, an attack protection layer 27 is formed to prevent the silicon substrate 20 from being attacked.

More specifically, the active area 25 exposed by the contact hole C1 is contacted to a metal wire or a bit line after carrying out a cleaning process. Herein, a buffered oxide enchant (BOE) or hydrogen fluoride (HF) is used in the cleaning process, and in case of a dry etching process, $NF_3$ or $C_xF_y$ is used for the cleaning process. As a next step, the attack protection layer 27 is formed selectively only on exposed active regions 25, more concretely on a bottom area of the contact hole. Herein, a poly-silicon layer or TiN layer both containing silicon (Si) or titanium (Ti) is mainly used as the attack protection layer 27 having a good electric conductivity and deposition property.

Firstly, in case of using the poly-silicon layer as the attack protection layer 27, the poly-silicon layer is deposited by using a chemical vapor deposition (CVD) process. Especially, $Si_2H_6/Cl/H_2$ is used as a source gas for the CVD process. Also, the CVD process is carried out at a temperature ranging from about 600° C. to about 700° C. in an ultra high vacuum condition, wherein a process pressure is maintained in a range from about 0.1 mtorr to about 1.0 mtorr. The poly-silicon layer is used not only to prevent the silicon substrate 20 attack caused by chlorine (Cl) gas during a succeeding Ti layer deposition process but also to serve as a silicon source during the $TiSi_2$ layer 30 formation process. For reference, the $TiSi_2$ layer 30 is shown in FIG. 2B.

In case that the TiN layer formed by the CVD process is used as the attack protection layer 27, the TiN layer is formed in an identical chamber in which the succeeding Ti layer deposition process is also carried out. At this time, $NH_3$ gas is added to the aforementioned source gas $TiCl_4$ and the mixed gas is used to deposit the TiN layer.

A deposition thickness ranging from about 50 Å to about 200 Å is most preferable for the TiN layer or the poly-silicon layer, and more desirably, the deposition thickness of the TiN layer should be smaller than that of the poly-silicon layer.

In case of using the TiN layer or the poly-silicon layer as the attack protection layer 27, both of the source gases used for the TiN and poly-silicon deposition processes both using the CVD process contain the chlorine gas. Accordingly, chlorine radical remains in the TiN layer or the poly-silicon layer. Therefore, an extra process is needed to remove the remnant chlorine radical.

There are preferably suggested methods for removing the remnant chlorine radical. Firstly, a deoxidization process using hydrogen ($H_2$) gas can be employed. Secondly, an ultra violet light having a higher energy than a binding energy of SiCl formed through a reaction between the silicon and the chlorine is illuminated to disconnect the binding between the chlorine and the silicon.

As another method, the above two described methods could be performed consecutively and repeatedly to remove the chlorine radical.

Consequently, the silicon substrate 20, specifically, the active area 25 is protected by the attack protection layer 27 during the succeeding Ti layer deposition process. Furthermore, a current leakage property could be improved by preventing a deterioration of a surface roughness caused by chlorine (Cl).

Referring to FIG. 2B, the Ti layer 28 is formed along a contact hole profile by using the CVD process. In addition, the TiN layer 29 is formed over the Ti layer 28. The $TiSi_2$ layer 30 is formed by a reaction between the Ti layer 28 and the silicon substrate 20 or poly-silicon attack protection layer 27 and thereby, forming the ohmic contact between the barrier metal layer and the silicon substrate, and the Ti layer 28/TiN layer 29 serve as the barrier metal layer.

In case of depositing the Ti layer 28, a low pressure chemical vapor deposition (LPCVD) process is used. Herein, the LPCVD process is carried out at a pressure ranging from about 1 torr to about 50 torr and a process temperature ranges from about 300° C. to about 700° C. In addition, ammonia ($NH_3$) gas and hydrogen ($H_2$) gas including Ar gas are added to the source gas $TiCl_4$. At this time, a flow amount ratio of the $NH_3$ gas to the Ar gas is about 1 to about 5.

As mentioned, the process temperature ranges from about 300° C. to about 700° C. However, a temperature range of about 600° C. to about 700° C. is most preferable.

The TiN layer deposition process is also carried out by using the LPCVD process with an in-situ method in the identical chamber where the Ti layer was formed. At this time, the LPCVD process is performed at a pressure ranging from about 1 torr to about 50 torr and a process temperature ranges from about 600° C. to about 700° C. In addition, $NH_3$ gas and $H_2$ gas including Ar gas are added to the source gas $TiCl_4$. At this time, a flow amount ratio of the $NH_3$ gas to the Ar gas is about 8 to about 15.

Furthermore, the $TiSi_2$ layer 30 can be formed simultaneously when the Ti layer 28 or the TiN layer 29 is formed or separately through an extra heat treatment process after finishing a succeeding metal wire or bit line formation process.

For more detailed explanation, in case that the Ti layer 28 and the TiN layer 29 are formed at a temperature less than about 300° C., the extra heat treatment process is required to be performed after depositing the Ti layer 28 or TiN layer 29, or forming the metal wire. At this time, a rapid thermal process (RTP) of which temperature ranges from about 700° C. to about 900° C. is preferable.

Furthermore, during the Ti layer 28 and the TiN layer 29 deposition processes, a temperature of the source gas $TiCl_4$ is fixed at about 25° C.

As mentioned, the process for removing the remnant chlorine (Cl) radical in the above deposited layers is additionally carried out. In addition, the metal wire 31 formed with such metal material as tungsten is formed on the barrier metal layer stacked with the Ti layer 28 and the TiN layer 29 by using only the CVD process or both of the CVD process or a physical vapor deposition (PVD) process.

In conclusion, the present invention is devised to overcome a drawback generated when the Ti layer is formed by using the source gas $TiCl_4$. The poly-silicon layer or TiN layer serving as the attack protection layer is formed on the bottom area of the contact hole before depositing the Ti layer. Accordingly, an attack of the silicon substrate caused by the source gas $TiCl_4$ during the Ti layer deposition process can be reduced by scarifying the attack protection layer. Consequently, an operation of the completed semiconductor device is carried out without a malfunction, and a product yield is also improved.

In conclusion, a process stabilization of depositing the Ti layer is obtained by selectively forming the attack protection layer in the contact hole, and a simplified deposition process is also obtained by controlling the flow amount ratio of the source gas $TiCl_4$ to the $NH_3$ gas and consecutively depositing Ti/TiN barrier metal layers.

While the present invention has been shown and described with respect to the particular embodiments, it will be apparent to those skilled in the art that many changes and modification may be made without departing from the spirit and scope of the invention as defined in the appended claims.

What is claimed is:

1. A method of forming a semiconductor device having a metal silicide by a low pressure chemical vapor deposition (LPCVD) process using a source gas of $TiCl_4$, comprising the steps of:
    forming a source/drain junction area on a silicon substrate;
    forming an attack protection layer on the source/drain junction area, wherein the attack protection layer is electrically conductive and prevents a silicon substrate attack caused by chlorine (Cl) gases generated from the source gas of $TiCl_4$;
    forming a titanium (Ti) layer over the attack protection layer through the LPCVD process;
    illuminating an ultra violet light having a higher energy than a binding energy of a SiCl reaction product on the surface of the Ti layer to remove remnant chlorine (Cl) components in the Ti layer; and
    diffusing the Ti layer into the attack protection layer to thereby form a metal silicide layer.

2. The method as recited in claim 1, wherein a poly-silicon layer formed by using a chemical vapor deposition (CVD) process is used for forming the attack protection layer.

3. The method as recited in claim 2, wherein the attack protection layer is formed by the CVD process using a source gas of $Si_2H_6/Cl/H_2$.

4. The method as recited in claim 2, wherein a thickness of the attack protection layer ranges from about 50 Å to about 200 Å.

5. The method as recited in claim 3, wherein the CVD process for forming the attack protection layer is carried out at a temperature ranging from about 600° C. to about 700° C. and at a pressure ranging from about 0.1 mtorr to about 1.0 mtorr.

6. The method as recited in claim 3, further comprising the step of deoxidizing the surface of the attack protection layer by using hydrogen ($H_2$) gas to remove remnant chlorine (Cl) components in the attack protection layer after depositing the attack protection layer.

7. The method as recited in claim 3, further comprising the step of illuminating an ultra violet light having a higher energy than a binding energy of SiCl on the surface of the attack protection layer to remove remnant chlorine (Cl) components in the attack protection layer.

8. The method as recited in claim 1, wherein a titanium nitride (TiN) layer formed by using a chemical vapor deposition (CVD) process is used for forming the attack protection layer.

9. The method as recited in claim 8, wherein the TiN layer is deposited by using the $TiCl_4$ source gas added with ammonia ($NH_3$) gas in an identical chamber where the Ti layer is subsequently deposited.

10. The method as recited in claim 8, wherein a thickness of the attack protection layer ranges from about 50 Å to about 200 Å.

11. The method as recited in claim 1, wherein the Ti layer is deposited by using the LPCVD process at a temperature ranging from about 600° C. to about 700° C. and at a pressure ranging from about 1 torr to about 50 torr.

12. The method as recited in claim 11, wherein the LPCVD process is performed by using the $TiCl_4$ source gas added with ammonia ($NH_3$) gas and hydrogen ($H_2$) gas including argon (Ar) gas and a flow amount ratio of the $NH_3$ gas to the Ar gas is about 1 to about 5.

13. A method for forming a barrier metal layer for a semiconductor device fabrication, comprising the steps of:

a) forming a contact hole exposing an active area through a selective etch of an insulation layer formed on a silicon substrate providing the active area;
b) forming an attack protection layer for preventing the silicon substrate attack caused by a succeeding titanium layer deposition process on the active area exposed by the contact hole, wherein the attack protection layer is electrically conductive;
c) forming a titanium (Ti) layer along a profile of the attack protection layer formed on the active area by using a low pressure chemical vapor deposition (LPCVD) process using a source gas of $TiCl_4$;
d) diffusing the Ti layer into the attack protection layer, thereby forming a metal silicide layer;
e) illuminating an ultra violet light having a bigger energy than a binding energy of SiCl on the surface of the Ti layer to remove remnant chlorine (Cl) components in the Ti layer; and
f) forming a titanium nitride (TiN) layer on the Ti layer.

14. The method as recited in claim 13, wherein a poly-silicon layer formed by a chemical vapor deposition (CVD) process is used as the attack protection layer.

15. The method as recited in claim 14, wherein the CVD process is carried out by using a source gas of $Si_2H_6/Cl/H_2$.

16. The method as recited in claim 15, wherein the CVD process for forming the attack protection layer is performed at a temperature ranging from about 600° C. to about 700° C. and at a pressure ranging from about 0.1 mtorr to about 1 mtorr.

17. The method as recited in claim 13, wherein a titanium nitride (TiN) layer formed by a chemical vapor deposition (CVD) process is used as the attack protection layer.

18. The method as recited in claim 17, wherein the attack protection layer is deposited by using the $TiCl_4$ source gas added with ammonia ($NH_3$) gas in an identical chamber where the Ti layer will be deposited.

19. The method as recited in claim 17, wherein a thickness of the attack protection layer ranges from about 10 Å to about 100 Å.

20. The method as recited in claim 13, wherein the Ti layer is deposited by using the LPCVD process at a temperature ranging from about 600° C. to about 700° C. and at a pressure ranging from about 1 torr to about 50 torr.

21. The method as recited in claim 20, wherein the LPCVD process is performed by using the $TiCl_4$ source gas added with ammonia ($NH_3$) gas and hydrogen ($H_2$) gas including argon (Ar) gas and a flow amount ratio of the $NH_2$ gas to the Ar gas is about 1 to about 5.

22. The method as recited in claim 13, wherein the TiN layer is deposited on the Ti layer by using the LPCVD process at a temperature ranging from about 600° C. to about 700° C. and at a pressure ranging from about 1 torr to about 50 torr.

23. The method as recited in claim 22, wherein the LPCVD process is performed by using the $TiCl_4$ source gas added with ammonia ($NH_3$) gas and hydrogen ($H_2$) gas including argon (Ar) gas and a flow amount ratio of the $NH_3$ gas to the Ar gas is about 8 to about 15.

24. The method as recited in claim 23, wherein the TiN layer is deposited in an identical chamber where the Ti layer is deposited.

25. The method as recited in claim 13, wherein the titanium silicide layer is produced by carrying out a heat treatment process at a temperature ranging from about 700° C. to about 900° C.

26. The method as recited in claim 13, wherein further comprising the step of deoxidizing the surface of the Ti layer using hydrogen ($H_2$) gas to remove remnant chlorine components after depositing the Ti layer and the TiN layer.

27. The method as recited in claim 15, further comprising the step of deoxidizing the surface of the attack protection layer using a hydrogen ($H_2$) gas to remove remnant chlorine components after depositing the attack protection layer, i.e., the poly-silicon layer.

28. The method as recited in claim 15, further comprising the step of illuminating an ultra violet light having a bigger energy than a binding energy of SiCl to remove remnant chlorine (Cl) components in the attack protection layer.

* * * * *